United States Patent
Narayanasamy et al.

(10) Patent No.: US 10,317,453 B2
(45) Date of Patent: Jun. 11, 2019

(54) DETECTION OF PLUNGER MOVEMENT IN DC SOLENOIDS THROUGH CURRENT SENSE TECHNIQUE

(71) Applicant: Texas Instruments Incorporated, Dallas, TX (US)

(72) Inventors: Navaneeth Kumar Narayanasamy, TamilNadu (IN); Manu Balakrishnan, Kerala (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/006,880

(22) Filed: Jun. 13, 2018

(65) Prior Publication Data
US 2018/0292445 A1   Oct. 11, 2018

Related U.S. Application Data

(63) Continuation of application No. 14/930,344, filed on Nov. 2, 2015.

(30) Foreign Application Priority Data

Nov. 3, 2014   (IN) ............................ 5512/CHE/2014

(51) Int. Cl.
  *H01H 47/00*   (2006.01)
  *G01R 31/06*   (2006.01)
  *G01D 5/20*   (2006.01)
  *H01F 7/18*   (2006.01)

(52) U.S. Cl.
  CPC ............ *G01R 31/06* (2013.01); *G01D 5/2006* (2013.01); *H01F 7/1844* (2013.01); *H01F 2007/185* (2013.01)

(58) Field of Classification Search
  CPC .................................................... G01R 31/06
  See application file for complete search history.

(56) References Cited

U.S. PATENT DOCUMENTS

| | | | | |
|---|---|---|---|---|
| 3,988,664 A | * | 10/1976 | Beery | ........................ B41J 9/52 324/423 |
| 5,442,671 A | * | 8/1995 | Wollschlager | ....... G01D 5/2013 324/207.11 |
| 5,477,149 A | | 12/1995 | Spencer et al. | |
| 5,784,245 A | | 7/1998 | Moraghan et al. | |
| 5,808,471 A | | 9/1998 | Rooke et al. | |
| 6,917,203 B1 | | 7/2005 | Perotti et al. | |
| 7,405,917 B2 | | 7/2008 | Ahrens et al. | |

* cited by examiner

*Primary Examiner* — Stephen W Jackson
(74) *Attorney, Agent, or Firm* — John R. Pessetto; Charles A. Brill; Frank D. Cimino

(57) ABSTRACT

An apparatus and method of detecting movement of a plunger of the solenoid includes detecting a peak ($I_{PEAK}$) in a current signal applied to a coil of the solenoid. A predetermined threshold is added to the current signal applied to the coil of the solenoid to generate a level shifted signal. The level shifted signal and the peak signal are compared to detect movement of a plunger of the solenoid.

19 Claims, 9 Drawing Sheets

DETECTION OF PLUNGER MOVEMENT IN DC SOLENOIDS THROUGH CURRENT SENSE TECHNIQUE

CROSS-REFERENCE TO RELATED APPLICATIONS

This continuation application claims priority to U.S. patent application Ser. No. 14/930,344, filed Nov. 2, 2015, which application claims priority to Provisional Indian Patent Application No. 5512/CHE/2014, filed Nov. 3, 2014, both of which are incorporated herein by reference in their entirety for all purposes.

FIELD

The invention generally relates to a solenoid controller and, more specifically to a solenoid detector that can detect complete plunger movement

BACKGROUND

Linear solenoids are electromechanical devices that convert electrical energy into a linear mechanical motion, which is used to control electrical, pneumatic or hydraulic systems. Solenoids are used in valves, relays and contactors.

Electromechanical solenoids consist of an electromagnetically inductive coil that is wound to encircle a movable steel or iron slug, termed "the armature" or "plunger." The coil is shaped such that the plunger can be moved in and out of its center, altering the inductance of the coil. The plunger is used to provide a mechanical force to activate the control mechanism, for example opening and closing of a valve.

A solenoid coil needs a higher current during activation, called the pull—in current, to pull the plunger into the solenoid. However, once the plunger has moved completely, the solenoid coil needs only approximately 30% of its nominal current, called "the hold current," to keep the plunger in the same position. DC solenoids having coils that operate continuously at their nominal current, which is limited by the resistance of the coil, will have an increase in temperature of the coil due to the higher power dissipation. Once the complete plunger movement is detected, the steady-state current can be reduced to the hold current to minimize the power consumption in the solenoid. The detection of the plunger movement is required in safety-critical applications to detect proper operation of the valve, relays or contactors. Movement of the plunger can be slow, due to factors such as friction, rusting and other mechanical impediments to the movement of the plunger.

FIG. 1 shows an example of a known solenoid drive circuit, shown generally as 100. A DC input voltage at 102 is applied to one terminal of a solenoid coil 104, the other terminal of the solenoid coil is connected to a transistor 108, controlling current through the solenoid, which is sensed by sense resistor $R_{SENSE}$ 110. Transistor 108 is controlled by current controlled solenoid driver 112, which will drive the solenoid at its nominal current until the plunger has moved completely, at which time the current can be reduced to its hold value. Freewheeling diode 106 is used to eliminate the sudden voltage spike seen across the transistor when it is switched off by the current controlled solenoid driver.

FIG. 2 shows the known excitation current waveform of a solenoid, generally as 200. As soon as the solenoid is energized at 202, the current begins to increase as shown at 204. When the current reaches $I_{PEAK}$ at 206, the plunger starts moving because of the sufficient magnetic field created by the solenoid coil. The movement of the plunger induces back EMF in the coil, and hence, the solenoid current starts dropping. At 208, the plunger has moved completely and the current dips to $I_{VALLEY}$. After the plunger strokes, the current continues on its normal upward path, as shown at 210, to its maximum value, as shown at 212, which is limited by the resistance of the coil. The prominent dip in the excitation curve from $I_{PEAK}$ to $I_{VALLEY}$ is an indication of plunger movement.

One known plunger position sensing method includes hall sensors to detect the position of the plunger. The mechanical mounting of these sensors are complex and their performance is affected by ageing and external field. In addition, the hall sensor will provide a signal at the end of the plunger movement, and therefore, cannot detect slow movement of the plunger.

Other plunger movement detection logic uses fixed references for detecting peak and valley current, or utilize algorithmic solutions. These algorithms may fail during temperature variation or during slow movement of plunger.

There is a need for a simple, low-cost and reliable technique for detecting complete solenoid movement that can detect plunger movement over wide variation of temperature and also detect slow-moving plungers.

SUMMARY

A method of detecting movement of a plunger of the solenoid, including detecting a peak ($I_{PEAK}$) in a current signal applied to a coil of the solenoid. A valley ($I_{VALLEY}$) in a current signal applied to a coil of the solenoid is detected. A predefined threshold is defined as the absolute difference between the peak and valley current signal. The predetermined threshold is added to the current signal applied to the coil of the solenoid to generate a level shifted signal. The level shifted signal and the peak signal are compared to detect movement of a plunger of the solenoid.

In a system for operating a solenoid, a circuit to detect complete movement of the plunger of the solenoid, includes a device for measuring current through the solenoid and generating a first current signal. An active peak detector circuit receives the first current signal for detecting a peak thereof and generating a peak detection signal. A level shifter circuit is coupled in parallel with the active peak detector and receives the first current signal, the level shifter circuit adding a threshold voltage to the first current signal to generate a level shifted signal. A comparator compares the peak detection signal with the level shifted signal, whereby if the level shifted signal matches the peak detection signal, complete movement of the solenoid is detected.

A control circuit for operating a solenoid includes a circuit applying a voltage across a solenoid coil and measuring current through the coil to generate a first signal. A detector circuit detects a peak in the current through the coil represented by the first signal. An adder circuit adds a predetermined threshold to the first signal. A comparator compares the output of the adder circuit to the output of the detector circuit to detect movement of the plunger of the solenoid.

BRIEF DESCRIPTION OF THE DRAWINGS

Further aspects of the invention will appear from the appending claims and from the following detailed description given with reference to the appending drawings:

DETAILED DESCRIPTION

The method and apparatus disclosed herein is based on change in current wave shape due to back EMF generated by plunger movement. In an embodiment, the detection circuit comprises of current sense amplifier, peak detector, level shifter and comparator.

The current, drawn by the solenoid just before start of plunger movement, is held by a peak detector. The circuit tracks the dip in current due to the back EMF generated by the plunger movement. If the dip in current is more than the predefined threshold, it is interpreted as complete movement of plunger. The threshold is set based on plunger characteristics.

If the solenoid is faulty or if the plunger did not move fully, or moved very slowly, then the circuit can generate a fault signal $I_{TRIP}$ that is equal to zero.

Figure 3:
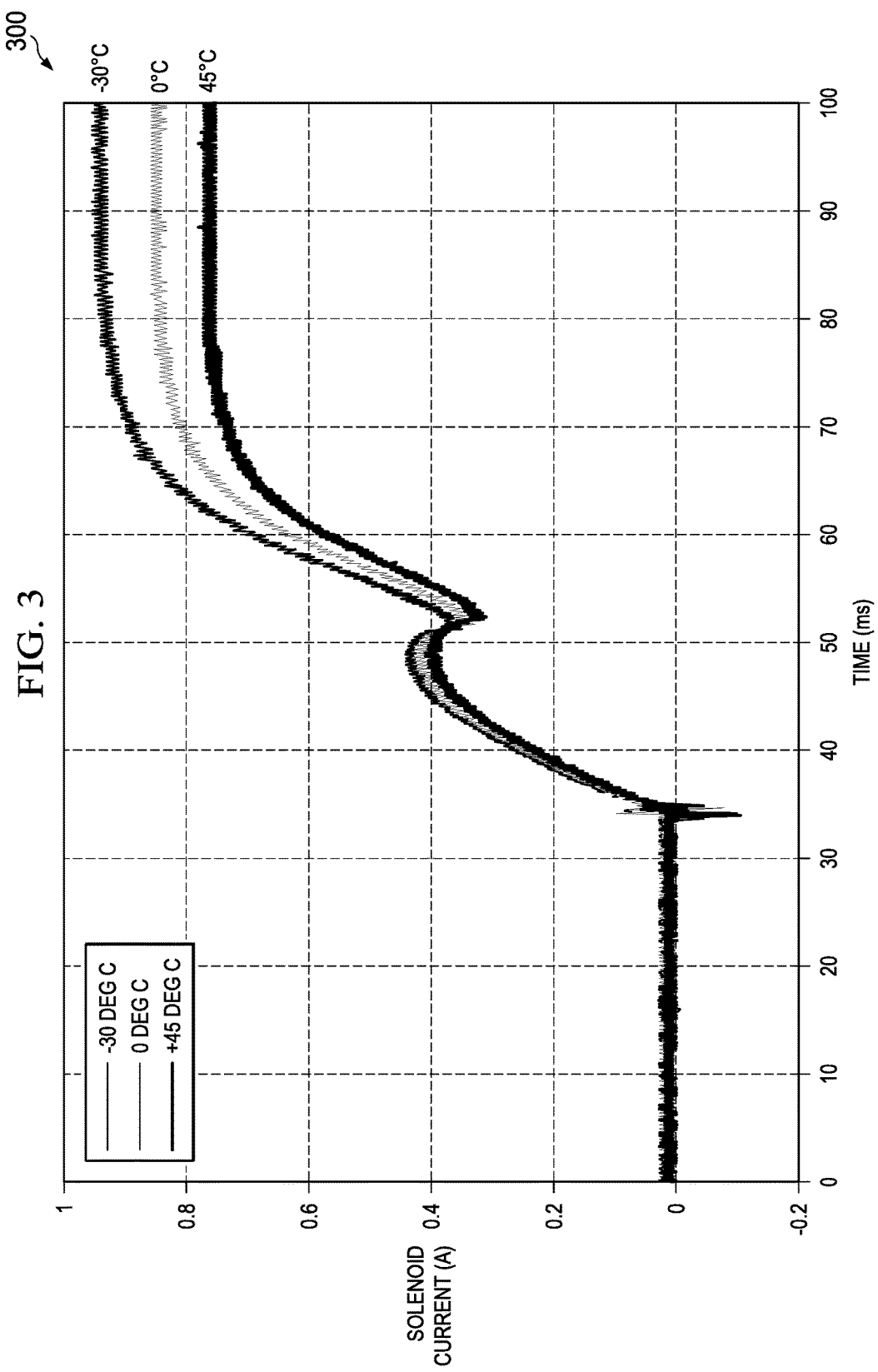
FIG. 3 shows the current drawn by the solenoid at different temperatures.

In order to study the effect of temperature on the excitation current, a typical solenoid is characterized at different temperatures. FIG. 3 shows the current drawn by the solenoid at 3 different temperatures, −30° C., 0° C. and +45° C. The curves shift up as the temperature decreases because of the reduction in resistance of the solenoid coil. However, it should be noticed that the difference between the peak ($I_{PEAK}$) and valley ($I_{VALLEY}$) of the solenoid current, due to back EMF, remains constant irrespective of the temperature. This characteristic of the solenoid current is utilized by the present disclosure in detecting the movement of the plunger of the solenoid.

Figure 4:
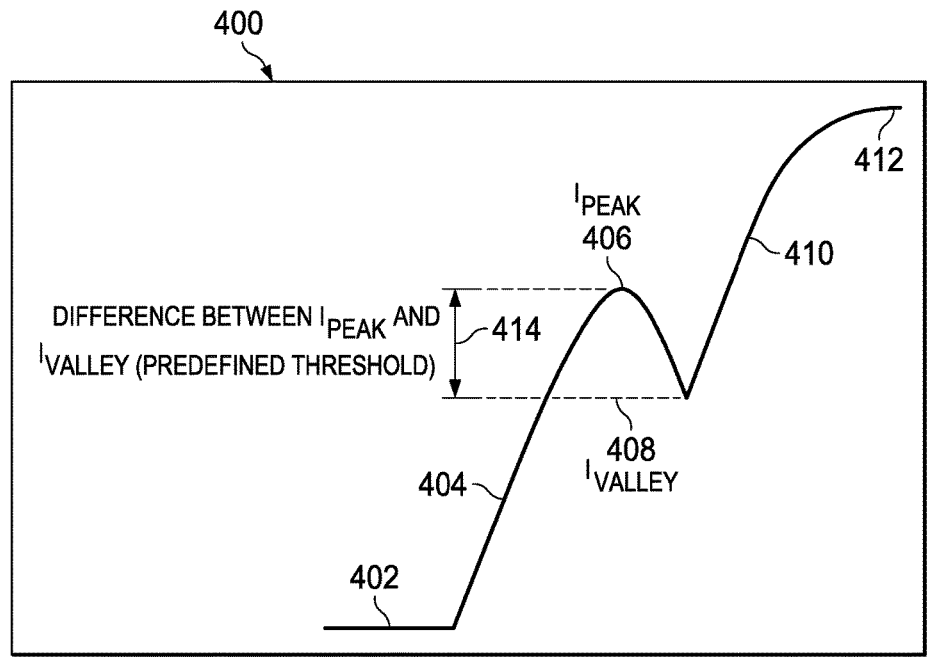
FIG. 4 shows the difference between $I_{PEAK}$ and $I_{VALLEY}$ (predefined threshold)

Referring now to FIG. 4, a solenoid current characteristic is shown generally as 400. When a voltage is applied to the solenoid, the current rises at 404 to a peak 406 and then drops back to a valley at 408 due to the back EMF of the solenoid coil. Once the plunger moves completely, the current will increase, as shown at 410, until it reaches its maximum at 412, which is determined by the coil resistance. The absolute difference between $I_{PEAK}$ at 406 and $I_{VALLEY}$ at 408 is measured and is used to define the threshold for the detection of plunger movement. The threshold is set slightly above $I_{VALLEY}$ and is referenced to $I_{PEAK}$ so as to reduce the effect of temperature on the detection circuit.

Figure 1:
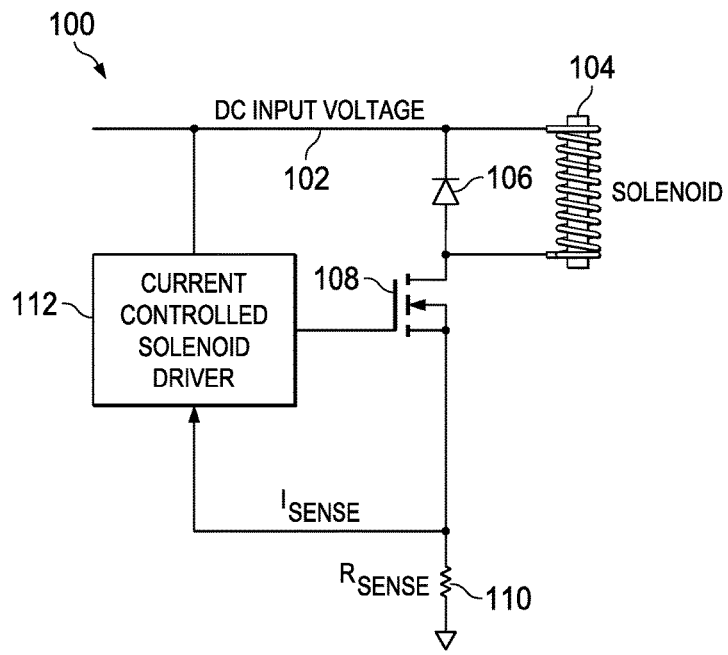
FIG. 1 shows an example of a known solenoid drive circuit.
Figure 2:
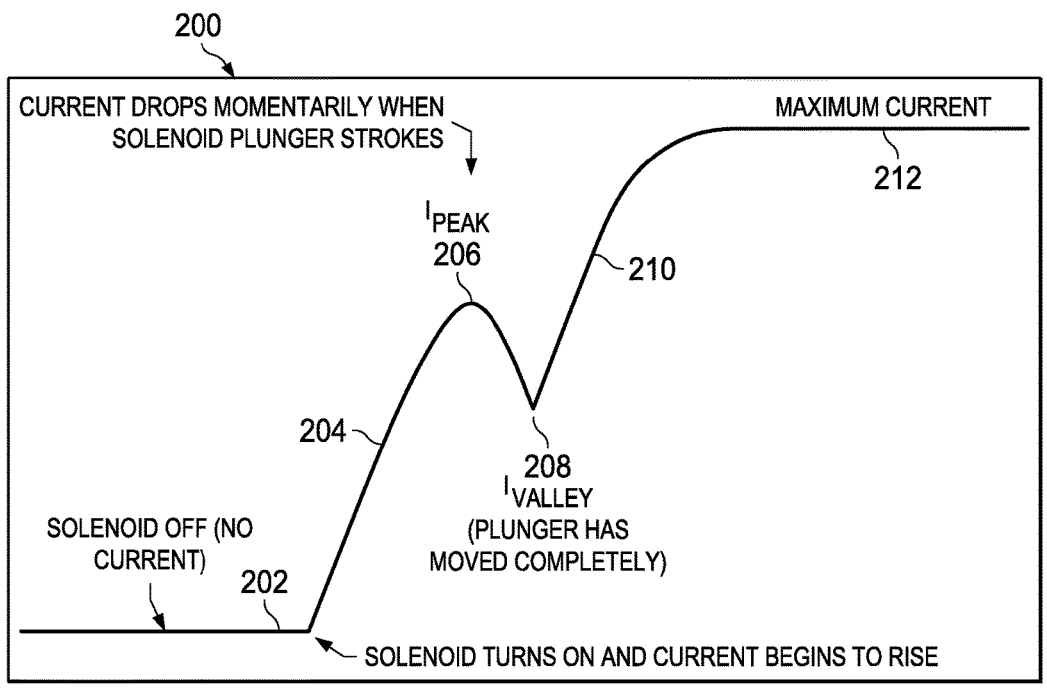
FIG. 2 shows the excitation current of a solenoid.
Figure 5:
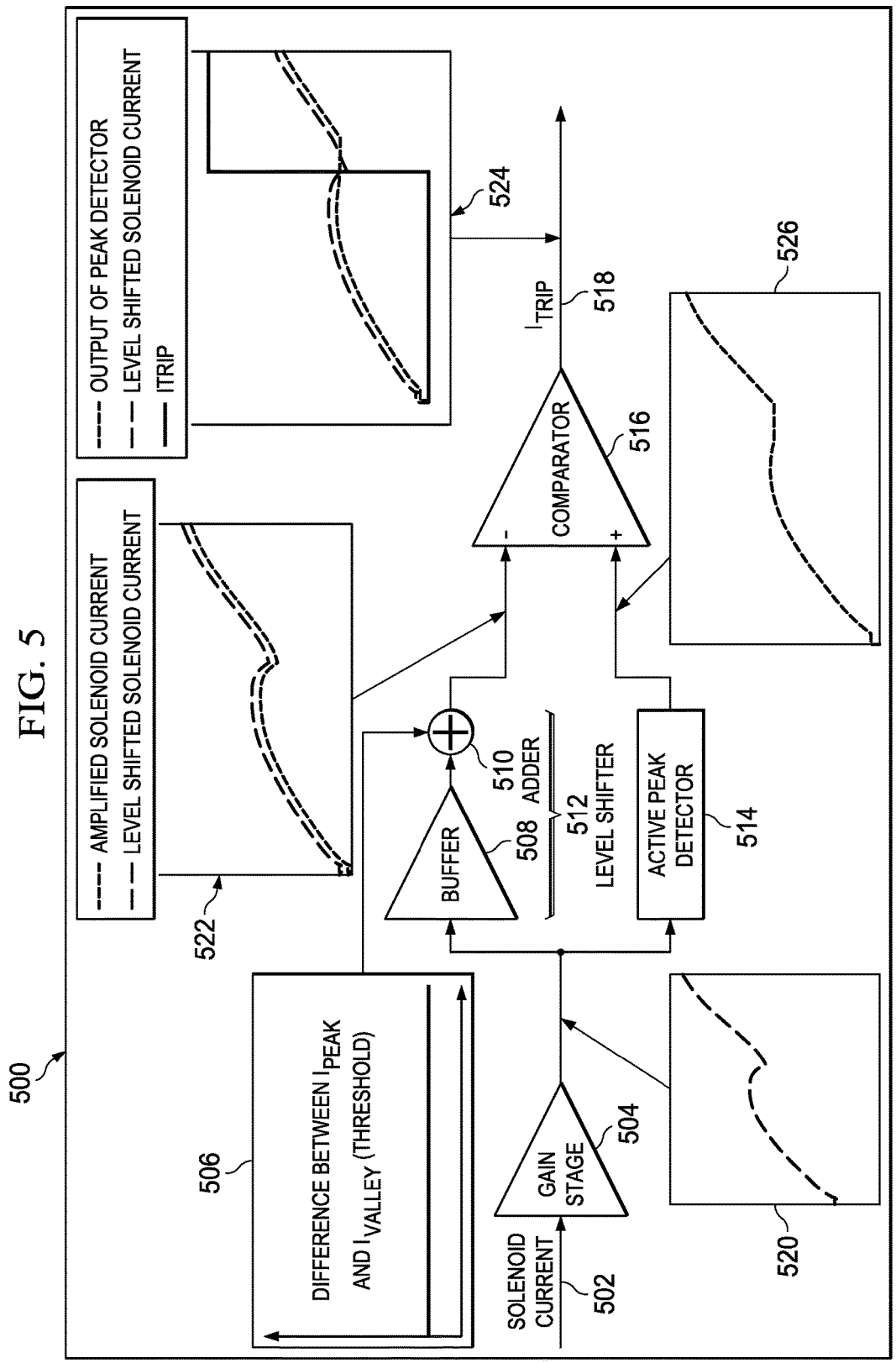
FIG. 5 is a block diagram of solenoid plunger position detection logic.

FIG. 5 shows a block diagram of a plunger movement detection circuit consisting of a gain stage, an active peak detector, an op-amp adder circuit and a comparator. This detection logic can be implemented utilizing simple op-amp circuits rather than using a sensor or controller. The solenoid current is detected using the sense resistor $R_{SENSE}$ shown in FIG. 1, which is applied to gain stage 504 at 502. The voltage across the resistor is filtered and amplified by the gain stage 504, which is configured as a differential amplifier, amplifying the voltage across the sense resistor to the suitable high-value in order to improve the noise immunity of the following circuits. The output of the differential amplifier gain stage 504, is shown by waveform 520, and is fed simultaneously to the active peak detector 514 and buffer 508. The active peak detector 514 is used to track the differential amplifier 504 output corresponding to the peak current ($I_{PEAK}$) during the excitation of the solenoid. The output of the peak detector is shown at 526.

Buffer circuit 508 and adder circuit 510 form a level shifter circuit 512, which is used to introduce a positive level shift equivalent to the predefined threshold 414 in FIG. 4. The threshold value that is added by adder circuit 510 to the output of buffer 508 is shown at 506. The output of the level shifter circuit is shown at 522. The signals shown at 522 and 526 are input to the comparator 516. The output of the adder circuit is input to the inverting input of the comparator 516 and the output of the active peak detector 514 is input to the non-inverting input of the comparator 516. Adding the threshold to the output of the gain stage 504 and comparing this to the output of the active peak detector results in a trip signal on the output 518 of comparator 516, when the two voltages substantially match. The output of the active peak detector 514 will store the value of the first peak such as peak 406 shown FIG. 4. As the solenoid current 400 drops to form the valley at 408, the value of the signal 520, plus the threshold, will substantially match the peak value of the signal 526, at the instant 408, triggering the comparator to produce the trip signal $I_{TRIP}$ 518. The trip signal 518 indicates that the plunger has completely moved within the solenoid.

Figure 6:
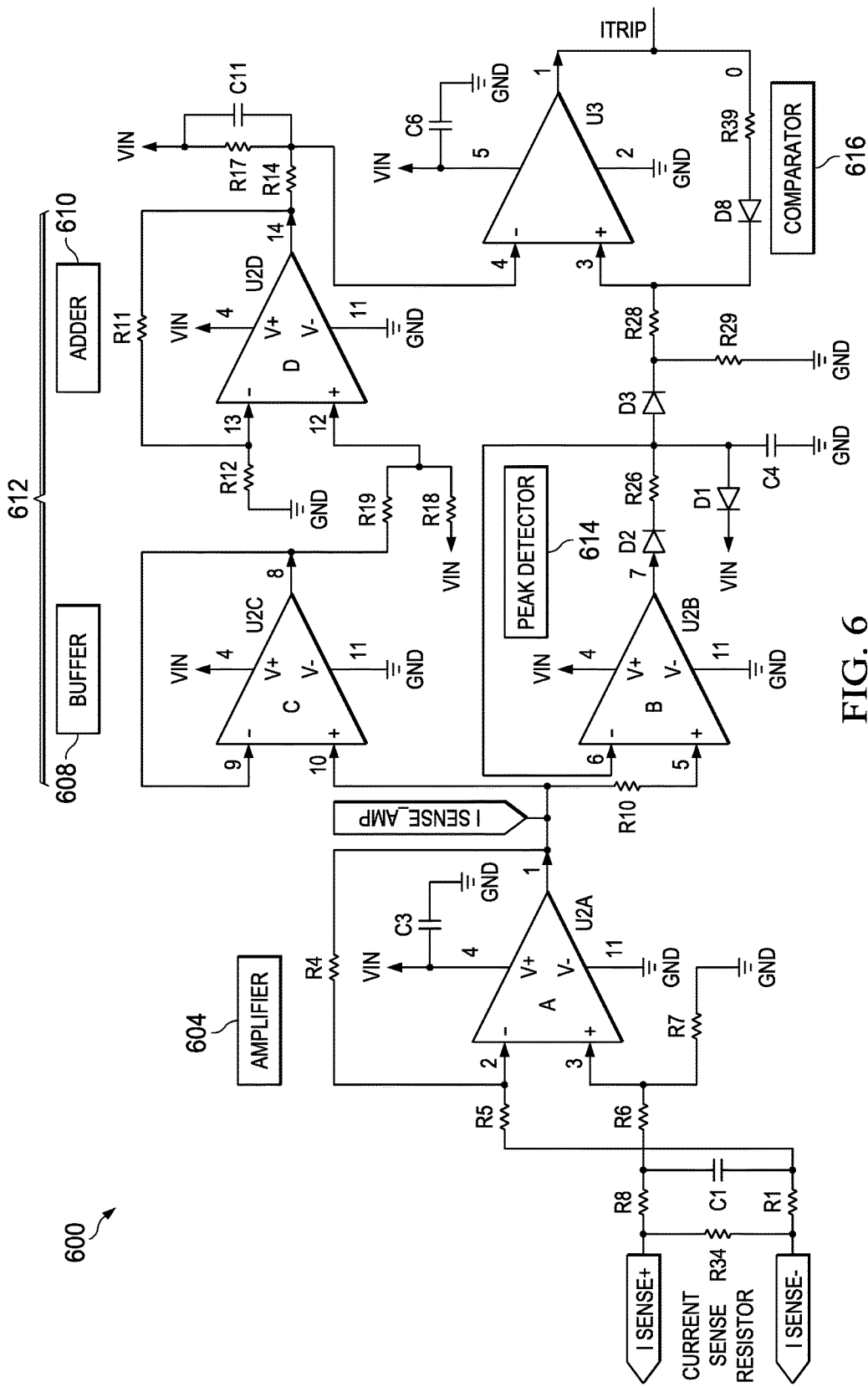
FIG. 6 shows the plunger position detection circuit consisting of an amplifier, active peak detector, op-amp adder circuit and a comparator with latch.

FIG. 6 shows a schematic diagram of block diagram 500, generally as 600. In FIG. 6, amplifier 604 receives the voltage from the current sense resistor $R_{SENSE}$ shown in FIG. 1 and as resistor R34 in FIG. 6, at the $I_{SENSE}+$ and $-I_{SENSE}-$ terminals. Differential amplifier 604 amplifies this voltage in order to increase noise immunity in the following circuits. Resistor R8, capacitor C1, and resistor R1, form a low pass filter to smooth the voltage developed across $R_{SENSE}$. The output of amplifier 604 is fed simultaneously to active peak detector 614 and buffer circuit 608. The output of the buffer circuit 608 is fed to adder circuit 610 which adds the threshold value to the output of the amplifier 604. The output of the adder circuit is fed to the inverting terminal of comparator 616. The output of the peak detector 614 is fed to the non-inverting input of comparator 616. Comparator 616 produces a signal $I_{TRIP}$ which identifies that the plunger of the solenoid has moved completely.

Figure 7:
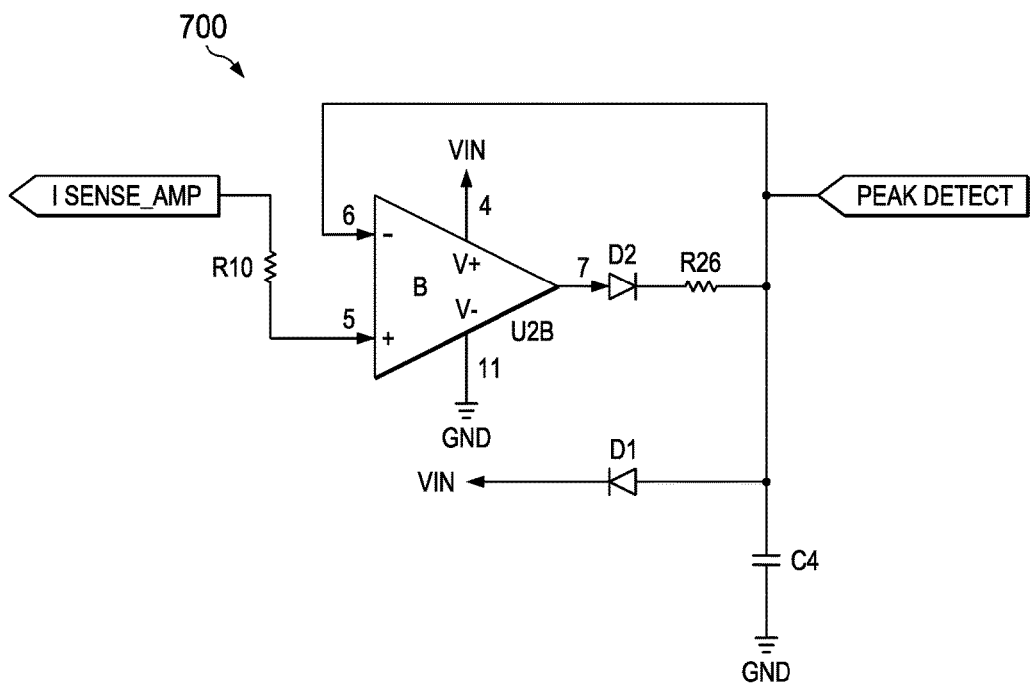
FIG. 7 shows the peak detector circuit.

The peak detector circuit shown in FIG. 6 is shown separately in FIG. 7, generally as 700. The output of differential amplifier U2A is fed to the active peak detector formed by the op-amp U2B, diode D2, resistor R26 and capacitor C4. The peak detector detects the maximum value of the signal over a period of time. A simple diode and capacitor can form a peak detector; however, adding an op-amp with feedback can eliminate the diode drop and make a more precise peak detector.

The output of differential amplifier U2A at ISENSE-AMP is fed to the non-inverting input of the op-amp U2B. The output of the op-amp U2B is connected to capacitor C4 through diode D2 and resistor R26. The node formed by resistor R26 and capacitor C4 is connected to the inverting input of op-amp U2B. The high differential gain of op-amp U2B causes the capacitor C4 to charge to a voltage that equals the non-inverting input voltage of the op-amp.

The presence of diode D2 and the ultra-low input bias current of op-amp U2B assures that the capacitor C4 will not discharge even if the non-inverting input of the op-amp U2B goes below the voltage across capacitor C4. This means that the voltage across capacitor C4 will always track the maximum value at the non-inverting terminal of the op-amp U2B.

A small resistor R26 is provided to increase the stability of op-amp U2B as it is charging the capacitor. VIN is the power supply to the op-amp. During times when the power is off, the VIN voltage suddenly reduces to zero. The diode D1 makes sure that during a power off situation, the capacitor C4 will discharge immediately, which helps tracking the solenoid current during the next power on sequence.

Figure 8:
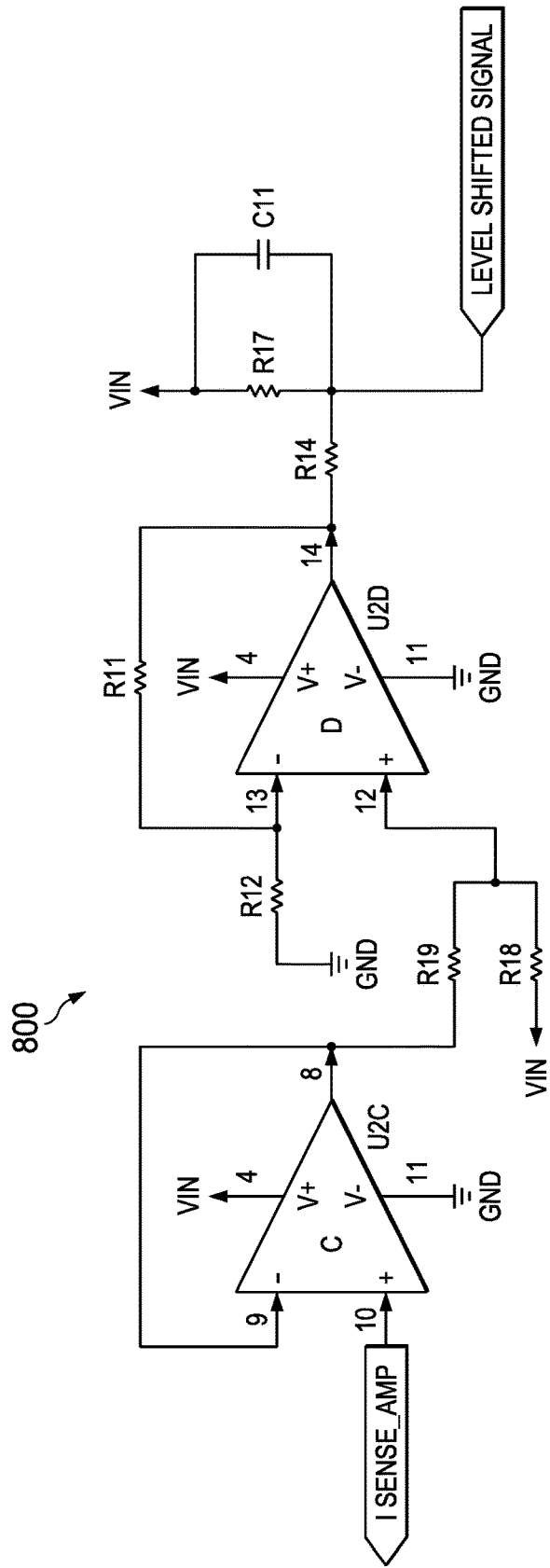
FIG. 8 shows the solenoid current level shifting circuit.

The level shifter circuit 612 of FIG. 6, is shown separately in FIG. 8, generally as 800. The op-amp U2C is the voltage buffer 608 and the op-amp U2D is the adder circuit 610. The two op-amps, U2C and U2D, are used to generate the level shifted waveform of the current sense signal. The adder circuit is used to provide a level shifting equal to the threshold defined by the characterization current curve for the solenoid. The threshold is the voltage equivalent of the difference between the peak and valley currents defined in FIG. 4. The op-amp U2C is used as a buffer. The buffer circuit ensures that the differential amplifier will not be loaded by the circuit components in the adder circuit. The function of the buffer U2C is to replicate the signal provided at its input to its output. The buffer offers a high input impedance and a low output impedance. The input of the buffer is the differential amplifier (U2A) output. This signal will then appear at the output of the buffer U2C.

The adder circuit is formed by op-amp U2D, resistors R18, R19, R12 and R11. The threshold can be set by adjusting the values of the resistors.

By selecting R11=R19 and R12=R18:

$$\text{Output of } U2D = I_{SENSE\_AMP} + \left(V_{IN} * \frac{R11}{R12}\right)$$

This equation allows the values of the resistors to be designed to add the required threshold to the output of the buffer. This means that the threshold is added to the output of the buffer to generate the level shifted waveform.

Figure 9:
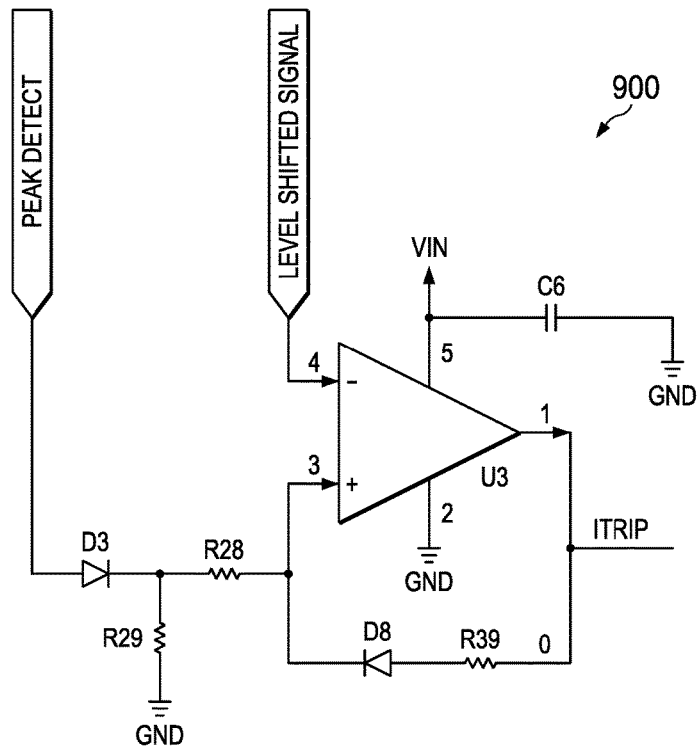
FIG. 9 shows the comparator circuit generating the signal $I_{TRIP}$.

The comparator 616 shown in FIG. 6 is shown separately in FIG. 9, generally as 900. The resistor R29 is used to avoid false latching of the comparator U3 during power-on. The components resistor R17 and capacitor C11 (see FIG. 6) also avoid power-on latching of the comparator U3. The resistor R17 will pull the inverting input of U3 to a positive voltage during power on, which depends upon the value of R17 and R14 (see FIG. 6), to make sure that the inverting input of U3 is greater than its non-inverting input to make sure that there will be no latching of U3 during power-on of the comparator.

In operation, the peak detector output is connected to the non-inverting input of the comparator through the diode D3 and resistor R28. The level shifted signal is connected to the inverting input of the comparator. VIN is a supply voltage for the comparator. The output of the comparator U3 will be a logic high, equal to VIN, when the non-inverting input voltage of U3 is higher than the inverting input voltage. Similarly, the output of the comparator U3 would be zero when the non-inverting input voltage of U3 is less than the inverting input voltage. The diode D8 will be reverse biased when the output of U3 is zero. The output of the comparator U3 is the signal $I_{TRIP}$.

At the start of the solenoid energization, the peak detector output voltage will be less than the level shifted signal. Therefore, the output of comparator U3 will be zero. When the solenoid plunger moves completely, the output of the peak detector would be higher than the level shifted signal, which makes the non-inverting input voltage of U3 higher than the inverting input voltage. Therefore, the output of U3 goes high. That means, the signal $I_{TRIP}$ goes to the voltage level VIN. This causes diode D8 to be forward-biased and hence non-inverting input of U3 becomes equal to the output voltage, which is VIN, minus the diode drop. This ensures that once the output of the comparator goes high, the non-inverting input is always higher than the inverting input and therefore the output latches to high. In other words, on complete movement of the solenoid plunger, the signal $I_{TRIP}$ goes from zero to high and latches there. The latching of $I_{TRIP}$ at the high-value ensures that any other monitoring circuit provided to monitor $I_{TRIP}$, will have enough time to process the signal. The state of $I_{TRIP}$ at VIN implies that the plunger has moved completely. The state of $I_{TRIP}$ at zero implies that the plunger has not moved or the plunger is faulty.

Figure 10:
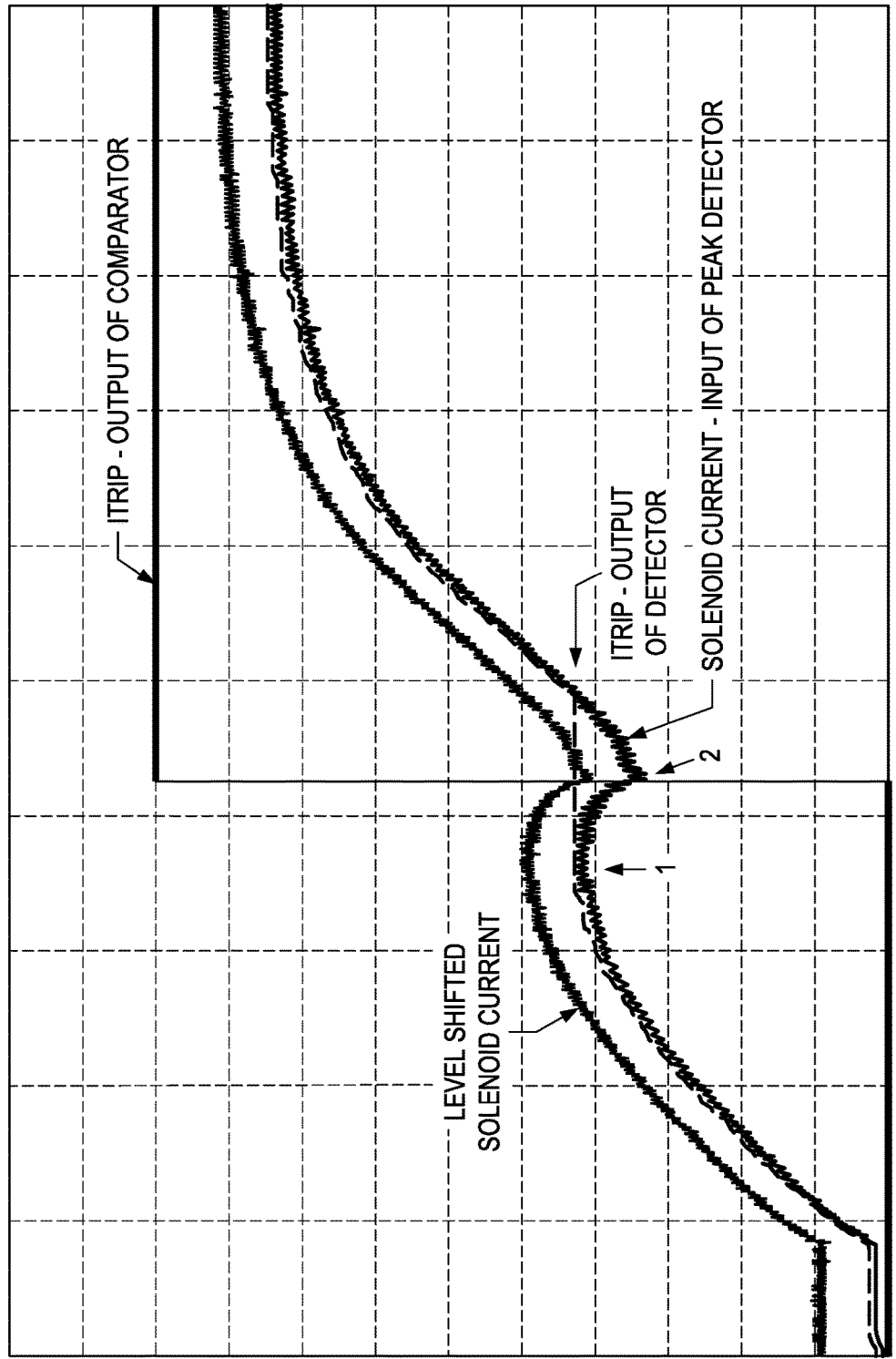
FIG. 10 shows plunger movement circuit waveforms.

FIG. 10 shows a detail of the working principle of the circuit. The output of the differential amplifier U2A, which is the amplified solenoid current, is fed to the peak detector. The peak detector output tracks the solenoid current until point 1, where the solenoid plunger starts moving. After this point, the solenoid current decreases because of the back EMF generated by the solenoid and the solenoid current dips to point 2. The output of the peak detector will remain at a value equal to the peak value at point 1 and is fed to the non-inverting input of the comparator U3. The inverting input of the comparator U3 is fed with the level shifted solenoid current signal. This waveform is derived by level shifting the solenoid current waveform by a voltage equal to the difference between the peak current at point 1 and the valley current at point 2, the threshold. At point 2, the non-inverting input voltage of the comparator (the peak detector output) becomes higher than the inverting input voltage (the output of the op-amp adder circuit) and the comparator output goes high and latches there.

Referring back to FIG. 3 which shows the current drawn by the solenoid at different temperatures, remember that the curves shift up as temperature decreases because of the reduction in the resistance of the solenoid coil. As stated in the description of FIG. 3, the difference between the peak and the valley of the solenoid current dip due to the back EMF remains constant irrespective of the temperature. The absolute difference between $I_{PEAK}$ and $I_{VALLEY}$ is measured and used to define the threshold for detection of plunger movement for a particular solenoid. The non-inverting input of the comparator is the output from the peak detector and the inverting input is the level shifted solenoid current waveform. The active peak detector output connected to the comparator ensures that the threshold is always referred to the peak current which makes the logic more immune to temperature variation. In FIG. 10, at point 2, in order to make sure that the level shifted waveform falls below the peak detector output, for the comparator trigger and latch, the threshold is referenced slightly above $I_{VALLEY}$. This ensures that the comparator inverting input will not be higher than the noninverting input voltage for sufficient time, such as more than 1 μs, for the comparator to act. When the solenoid current drops below the predetermined threshold, the comparator output will go high indicating that the plunger has moved completely.

Figure 11:
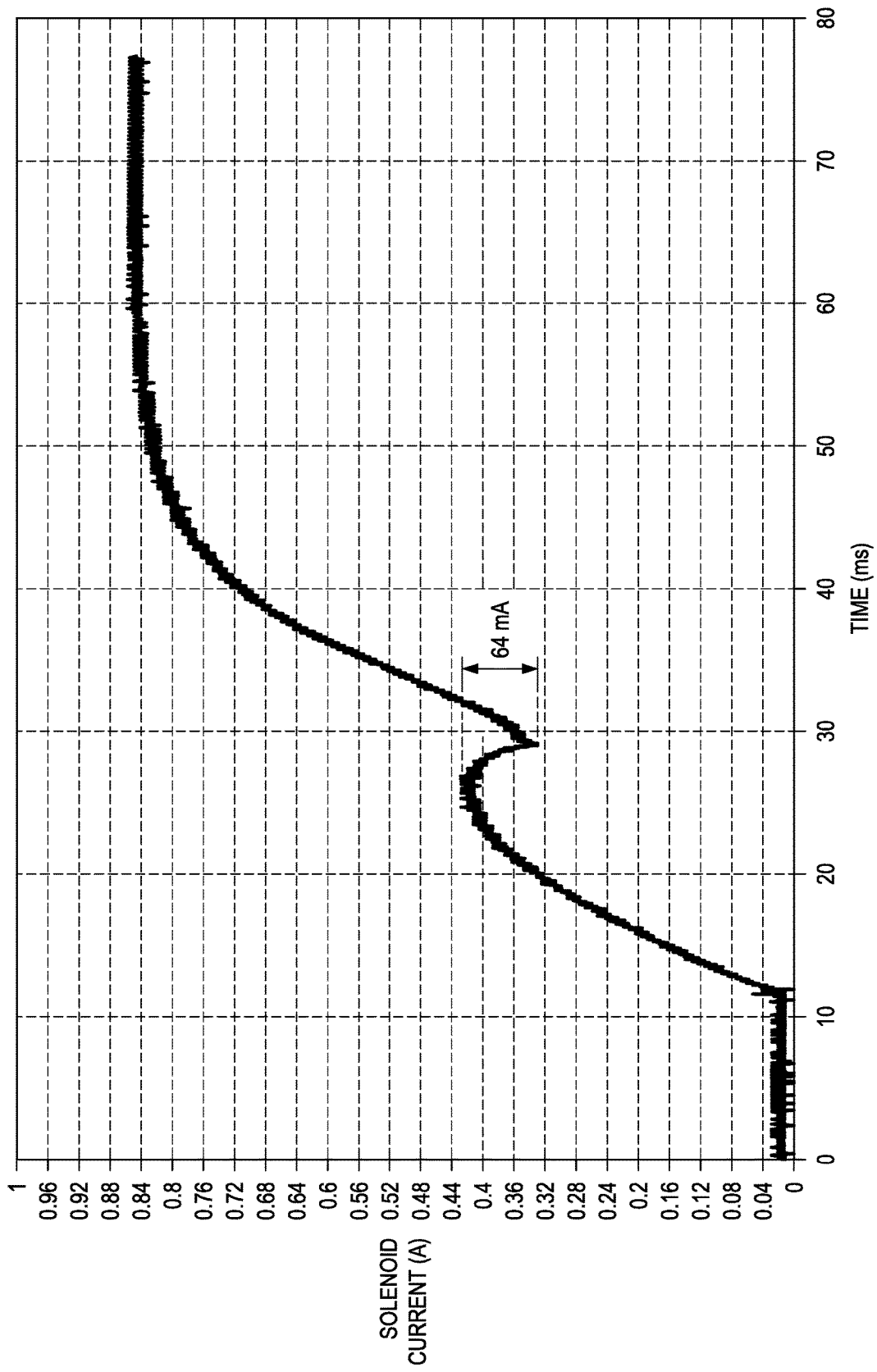
FIG. 11 shows finding the threshold from the solenoid excitation current characteristics.

FIG. 11 shows how the threshold is determined for a solenoid. The threshold is found by using the excitation current characteristics of a "healthy" solenoid. A typical solenoid is tested, experimentally, to find out the current characteristics. The rated DC voltage is applied across the solenoid, the excitation current waveform is captured and the difference between the peak and valley currents are measured as shown in FIG. 11.

Figure 12:
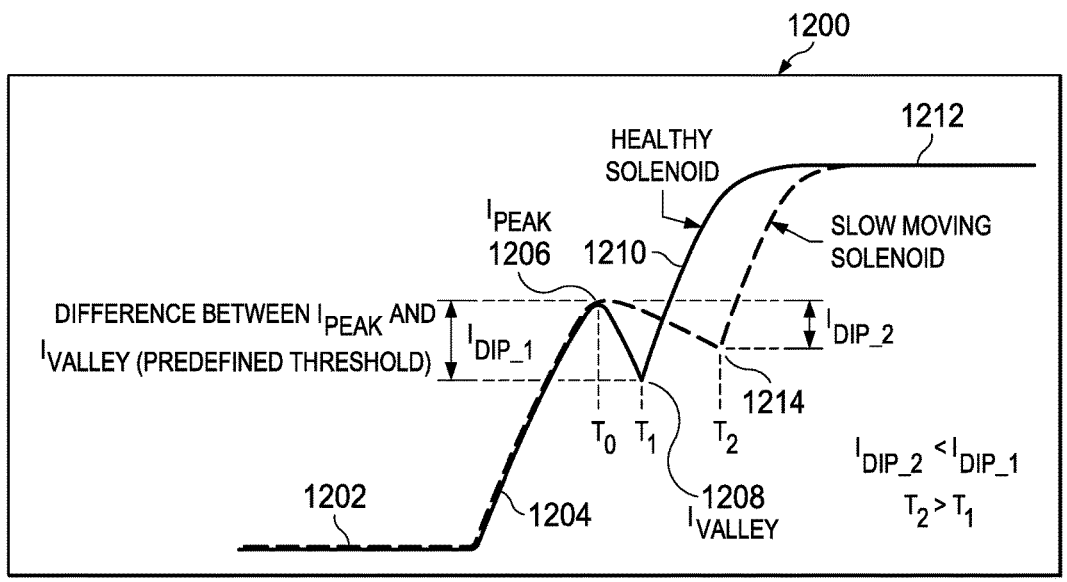
FIG. 12 compares the excitation characteristics of a normal and a slow-moving plunger in a solenoid.

Prolonged operation of solenoid can cause a plunger movement to become slow due to factors such as friction, rusting and other factors. For example, if the plunger is expected to move 10 mm within 10 ms, and if it does not move at the same speed as expected, the back EMF, generated in the solenoid coil, will be less. Hence, the magnitude of the current dip will not be equal to that of a "healthy" solenoid. As shown in FIG. 12, generally as 1200, when the plunger movement is slow, that is the time T2 is greater than T1, the magnitude of the current dip $I_{DIP2}$ will be less than the current dip $I_{DIP1}$, as shown in FIG. 12. This will cause the waveform to have a delayed and lower dip as shown in FIG. 12 at time T2, which causes the comparator output to remain at zero. This can be utilized to detect a faulty solenoid.

Although the invention has been described in detail, it should be understood that various changes, substitutions and alterations, may be made thereto without departing from the spirit or scope of the invention as defined by the appended claims.

The invention claimed is:

1. A method of detecting movement of a plunger of a solenoid comprising:
   detecting a peak ($I_{PEAK}$) in a current signal applied to a coil of the solenoid;
   detecting a valley in the current signal applied to the coil of the solenoid to generate a valley signal ($I_{VALLEY}$);
   adding a predetermined threshold to the current signal applied to the coil of the solenoid to generate a level shifted signal;
   comparing the level shifted signal and the peak signal to detect movement of a plunger of the solenoid;
   wherein the threshold is related to an absolute value of the difference between $I_{PEAK}$ and $I_{VALLEY}$.

2. The method of claim 1 within the threshold is determined by measuring characteristics of the solenoid.

3. A method of detecting movement of a plunger of a solenoid comprising:
   detecting a peak ($I_{PEAK}$) in a current signal applied to a coil of the solenoid;
   detecting a valley in the current signal applied to the coil of the solenoid to generate a valley signal ($I_{VALLEY}$);
   adding a predetermined threshold to the current signal applied to the coil of the solenoid to generate a level shifted signal;
   comparing the level shifted signal and the peak signal to detect movement of a plunger of the solenoid;
   wherein if the current signal does not have a dip at least equal to the predetermined threshold, a fault signal is generated.

4. A method of detecting movement of a plunger of a solenoid comprising:
   detecting a peak ($I_{PEAK}$) in a current signal applied to a coil of the solenoid;
   detecting a valley in the current signal applied to the coil of the solenoid to generate a valley signal ($I_{VALLEY}$);
   adding a predetermined threshold to the current signal applied to the coil of the solenoid to generate a level shifted signal;
   comparing the level shifted signal and the peak signal to detect movement of a plunger of the solenoid;
   wherein if the current signal has a dip at least equal to the predetermined threshold, current to the solenoid is reduced to its hold value.

5. The method of claim 4 wherein the threshold is added to a voltage representing coil current which is compared with an output of an active peak detector, if the level shifted voltage matches the output of the active peak detector, complete solenoid movement has been detected.

6. The method of claim 3 wherein a dip less than the threshold indicates an unacceptably slower plunger movement.

7. In a system for operating a solenoid, a circuit to detect complete movement of a plunger of a solenoid, comprising:
   a device for measuring current through the solenoid and generating a first current signal;
   an active peak detector circuit receiving the first current signal for detecting a peak thereof and generating a peak detection signal;
   a level shifter circuit coupled in parallel with the active peak detector and receiving the first current signal, the level shifter circuit adding a threshold voltage to the first current signal to generate a level shifted signal; and
   a comparator comparing the peak detection signal with the level shifted signal, whereby if the level shifted signal matches the peak detection signal, complete movement of the solenoid is detected;
   wherein the threshold is related to an absolute value of the difference between a current peak and a current valley.

8. In a system for operating a solenoid, a circuit to detect complete movement of a plunger of a solenoid, comprising:
   a device for measuring current through the solenoid and generating a first current signal;
   an active peak detector circuit receiving the first current signal for detecting a peak thereof and generating a peak detection signal;
   a level shifter circuit coupled in parallel with the active peak detector and receiving the first current signal, the level shifter circuit adding a threshold voltage to the first current signal to generate a level shifted signal; and
   a comparator comparing the peak detection signal with the level shifted signal, whereby if the level shifted signal matches the peak detection signal, complete movement of the solenoid is detected;
   wherein the threshold is determined by measuring characteristics of the solenoid.

9. In a system for operating a solenoid, a circuit to detect complete movement of a plunger of the solenoid, comprising:
   a device for measuring current through the solenoid and generating a first current signal;
   an active peak detector circuit receiving the first current signal for detecting a peak thereof and generating a peak detection signal;
   a level shifter circuit coupled in parallel with the active peak detector and receiving the first current signal, the level shifter circuit adding a threshold voltage to the first current signal to generate a level shifted signal; and
   a comparator comparing the peak detection signal with the level shifted signal, whereby if the level shifted signal matches the peak detection signal, complete movement of the solenoid is detected;
   wherein if the first current signal does not have a dip at least equal to the predetermined threshold, a fault signal is generated.

10. In a system for operating a solenoid, a circuit to detect complete movement of a plunger of the solenoid, comprising:
- a device for measuring current through the solenoid and generating a first current signal;
- an active peak detector circuit receiving the first current signal for detecting a peak thereof and generating a peak detection signal;
- a level shifter circuit coupled in parallel with the active peak detector and receiving the first current signal, the level shifter circuit adding a threshold voltage to the first current signal to generate a level shifted signal; and
- a comparator comparing the peak detection signal with the level shifted signal, whereby if the level shifted signal matches the peak detection signal, complete movement of the solenoid is detected;
- wherein if the first current signal does not have a dip at least equal to the predetermined threshold, the solenoid current controller continues to drive the solenoid at its nominal current.

11. In a system for operating a solenoid, a circuit to detect complete movement of a plunger of the solenoid, comprising:
- a device for measuring current through the solenoid and generating a first current signal;
- an active peak detector circuit receiving the first current signal for detecting a peak thereof and generating a peak detection signal;
- a level shifter circuit coupled in parallel with the active peak detector and receiving the first current signal, the level shifter circuit adding a threshold voltage to the first current signal to generate a level shifted signal; and
- a comparator comparing the peak detection signal with the level shifted signal, whereby if the level shifted signal matches the peak detection signal, complete movement of the solenoid is detected;
- wherein if the first current signal has a dip at least equal to the predetermined threshold, current to the solenoid is reduced to its hold value.

12. In a system for operating a solenoid, a circuit to detect complete movement of a plunger of the solenoid, comprising:
- a device for measuring current through the solenoid and generating a first current signal;
- an active peak detector circuit receiving the first current signal for detecting a peak thereof and generating a peak detection signal;
- a level shifter circuit coupled in parallel with the active peak detector and receiving the first current signal, the level shifter circuit adding a threshold voltage to the first current signal to generate a level shifted signal; and
- a comparator comparing the peak detection signal with the level shifted signal, whereby if the level shifted signal matches the peak detection signal, complete movement of the solenoid is detected;
- wherein the threshold voltage is added to a voltage representing coil current which is compared with an output of an active peak detector, if the level shifted voltage matches the output of the active peak detector, complete solenoid movement has been detected.

13. A control circuit for operating a solenoid comprising:
- a circuit for applying a voltage across a solenoid coil and measuring current through the coil to generate a first signal;
- a detector circuit detecting a peak in the current through the coil represented by the first signal;
- a circuit for detecting a valley in the first signal;
- an adder circuit for adding a predetermined threshold to the first signal;
- a comparator comparing output of the adder circuit to the peak signal to detect movement of the plunger of the solenoid;
- wherein the threshold is related to an absolute value of the difference between the peak and valley currents.

14. The control circuit of claim 13 wherein the threshold is determined by measuring characteristics of the solenoid.

15. A control circuit for operating a solenoid comprising:
- a circuit for applying a voltage across a solenoid coil and measuring current through the coil to generate a first signal;
- a detector circuit detecting a peak in the current through the coil represented by the first signal;
- a circuit for detecting a valley in the first signal;
- an adder circuit for adding a predetermined threshold to the first signal;
- a comparator comparing output of the adder circuit to the peak signal to detect movement of the plunger of the solenoid;
- wherein the current signal does not have a dip at least equal to the predetermined threshold, a fault signal is generated.

16. A control circuit for operating a solenoid comprising:
- a circuit for applying a voltage across a solenoid coil and measuring current through the coil to generate a first signal;
- a detector circuit detecting a peak in the current through the coil represented by the first signal;
- a circuit for detecting a valley in the first signal;
- an adder circuit for adding a predetermined threshold to the first signal;
- a comparator comparing output of the adder circuit to the peak signal to detect movement of the plunger of the solenoid;
- wherein if the first current signal does not have a dip at least equal to the predetermined threshold, the solenoid current controller continues to drive the solenoid at its nominal current.

17. A control circuit for operating a solenoid comprising:
- a circuit for applying a voltage across a solenoid coil and measuring current through the coil to generate a first signal;
- a detector circuit detecting a peak in the current through the coil represented by the first signal;
- a circuit for detecting a valley in the first signal;
- an adder circuit for adding a predetermined threshold to the first signal;
- a comparator comparing output of the adder circuit to the peak signal to detect movement of the plunger of the solenoid;
- wherein if the current signal has a dip at least equal to the predetermined threshold, current to the solenoid is reduced to its hold value.

18. A control circuit for operating a solenoid comprising:
- a circuit for applying a voltage across a solenoid coil and measuring current through the coil to generate a first signal;
- a detector circuit detecting a peak in the current through the coil represented by the first signal;
- a circuit for detecting a valley in the first signal;
- an adder circuit for adding a predetermined threshold to the first signal;
- a comparator comparing output of the adder circuit to the peak signal to detect movement of the plunger of the solenoid;

wherein the threshold is added to a voltage representing coil current which is compared with a output of active peak detector, if the level shifted voltage matches the output of the active peak detector, complete solenoid movement has been detected.

19. The control circuit of claim 15 wherein a dip less than the threshold indicates an unacceptably slower plunger movement.

* * * * *